United States Patent
Bitran et al.

(10) Patent No.: US 6,792,054 B1
(45) Date of Patent: Sep. 14, 2004

(54) METHOD FOR REDUCING COMPLEX FREQUENCY DOWN-CONVERSION IMPAIRMENTS

(75) Inventors: Yigal Bitran, Tel Aviv (IL); Oded Melamed, Shoam (IL); Nir Sasson, Ein-Sarid (IL)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/539,995

(22) Filed: Mar. 30, 2000

Related U.S. Application Data

(60) Provisional application No. 60/126,832, filed on Mar. 30, 1999.

(51) Int. Cl.$^7$ .............................. H03D 1/00; H04L 27/06
(52) U.S. Cl. ........................................ 375/343; 375/346
(58) Field of Search ................................. 375/340–352, 375/134, 147, 150, 235; 702/77; 342/62; 370/515, 335

(56) References Cited

U.S. PATENT DOCUMENTS

| | | | | |
|---|---|---|---|---|
| 4,672,638 A | * | 6/1987 | Taguchi et al. | 375/346 |
| 5,881,057 A | * | 3/1999 | Komatsu | 370/335 |
| 6,377,620 B1 | * | 4/2002 | Ozluturk et al. | 375/235 |

* cited by examiner

Primary Examiner—Stephen Chin
Assistant Examiner—Curtis Odom
(74) Attorney, Agent, or Firm—Wade James Brady, III; Frederick J. Telecky, Jr.

(57) ABSTRACT

An improved receiver is provided having a voltage controlled amplifier for adjusting the gain of a first input signal, a comparator and integrator for controlling the voltage controlled amplifier and connected to the output of the voltage controlled amplifier and connected to a second input signal, a cross-correlator connected to the output of the voltage controlled amplifier and the second input signal, first auto correlator connected to the output of the voltage controlled amplifier, a second auto correlator connected to the second input signal, a first mixer connected to the cross-correlator and the output of the voltage controlled amplifier for providing a correction signal to the signal output by the second auto correlator, and a second mixer connected to the cross-correlator and the second input signal for providing a correction signal to the signal output by the first auto correlator.

2 Claims, 3 Drawing Sheets

ANALOG DOWN CONVERTER

DIGITAL GAIN EQUALIZER | DIGITAL PHASE RECTIFIER

METHOD FOR REDUCING COMPLEX FREQUENCY DOWN-CONVERSION IMPAIRMENTS

This application claims priority under 35 USC §119(e)(1) of Provisional Application Serial No. 60/126,832 filed Mar. 30, 1999.

TECHNICAL FIELD OF THE INVENTION

The present invention relates to method for reducing complex frequency down-conversion impairments.

BACKGROUND OF THE INVENTION

There are several frequency down-conversion techniques for passband signals. The most common are:

1. Direct conversion: The passband signal is down-converted directly to baseband. This scheme minimizes the number of associated components, but usually suffers from noise generated by several sources (DC offsets, power supply noise, 1/f noise, etc.).

2. Single/Dual conversion: The received signal is down-converted to an intermediate frequency (IF) from which it is demodulated/sampled and demodulated. This conversion has a major downfall known as the image frequency interference; signals residing at the frequencies $f_{LO} \pm f_{IF}$ both downconvert to the same IF frequency. One solution to this problem is to filter the image signal before down-converting it; another solution is complex down-conversion.

3. Mixed real and complex down-conversion: This conversion involves both previous conversions, where the first one or two conversions are real and the last one is complex.

Complex conversion uses two local oscillators (shifted by 90 degrees) and two mixers to form two orthogonal output signals. One is referred to as "Real" and the other as "Imaginary". This complex down-conversion has no image frequency problem as long as the two signal paths are symmetric. Implementing complex conversion using analog components (phase shifter and mixer) causes phase, gain and delay mismatches. The first two delays are directly addressed by the present invention. The delay mismatch can be regarded as phase mismatch as long as the signal bandwidth is relatively small with respect to its center frequency.

SUMMARY OF THE INVENTION

The present invention provides a signal processing method for substantially reducing gain and phase mismatches, which occurs in analog complex conversion. The gain and phase imbalance in complex conversion result from limited image rejection in the frequency conversion. The present invention provides a method to estimate the phase and gain mismatches by means of signal processing and then compensating for the estimated impairments. Using the method of the present invention, image rejection in the complex conversion is enhanced.

BRIEF DESCRIPTION OF DRAWINGS

For a more complete understanding of the present invention, reference is now made to the accompanying drawings, as more fully described in the detailed description later herein, in which.

DETAILED DESCRIPTION

The gain and phase mismatch impact on image rejection will now be analyzed.

Assuming the received signal:

$$s(t) = A(t)\cos(\omega_0 t + \phi(t))$$

And local oscillator:

$$lo(t) = \cos(\omega_{LO} t) - j\alpha \sin(\omega_{LO} t + \beta)$$

A possible interfering image signal is of the form:

$$Im(t) = B(t)\cos((2\omega_{LO} - \omega_0)t + \phi(t))$$

Both the signal and the image contribute energy components in both frequencies $f_{IF}, -f_{IF}$. Calculating the main products of the output, and assuming low-pass filters, yields:

$$i_{signal}(t) = \frac{1}{2}A(t)\cos(\omega_{IF} t + \phi(t))$$

$$q_{signal}(t) = \frac{1}{2}\alpha A(t)\sin(\omega_{IF} t + \phi(t) + \beta)$$

$$i_{image}(t) = \frac{1}{2}B(t)\cos(\omega_{IF} t - \varphi(t))$$

$$q_{image}(t) = -\frac{1}{2}\alpha B(t)\sin(\omega_{IF} t + \beta - \varphi(t))$$

$$\omega_{IF} \equiv \omega_0 - \omega_t$$

$$i(t) \equiv i_{signal}(t) + i_{image}(t)$$

$$q(t) \equiv q_{signal}(t) + q_{image}(t).$$

The signal and image main components reside at two different frequencies; the signal resides mainly around $f_{IF}$ while the image resides mainly around $-f_{IF}$. Calculating the signals power around $f_{IF}$ and the image power around $-f_{IF}$:

$$P_{signal} = \frac{1}{16}|A(t)|^2[(1 + \alpha\cos\beta)^2 + \alpha^2\sin^2\beta]$$

$$P_{image} = \frac{1}{16}|B(t)|^2[(1 - \alpha\cos\beta)^2 + \alpha^2\sin^2\beta]$$

The image rejection is the ratio of these two power products:

$$IR(\alpha, \beta) = \frac{(1 - \alpha\cos\beta)^2 + \alpha^2\sin^2\beta}{(1 + \alpha\cos\beta)^2 + \alpha^2\sin^2\beta}$$

Assuming no gain mismatch yields:

$$IR(1, \beta) = \frac{1 - \cos\beta}{1 + \cos\beta} \xrightarrow{\beta \to 0} \frac{1}{4}\sin^2\beta$$

While assuming no phase mismatch yields:

$$IR(\alpha, 0) = \frac{(1 - \alpha)^2}{(1 + \alpha)^2} \xrightarrow{\alpha \to 1} \frac{1}{4}(1 - \alpha)^2$$

Figure 1:
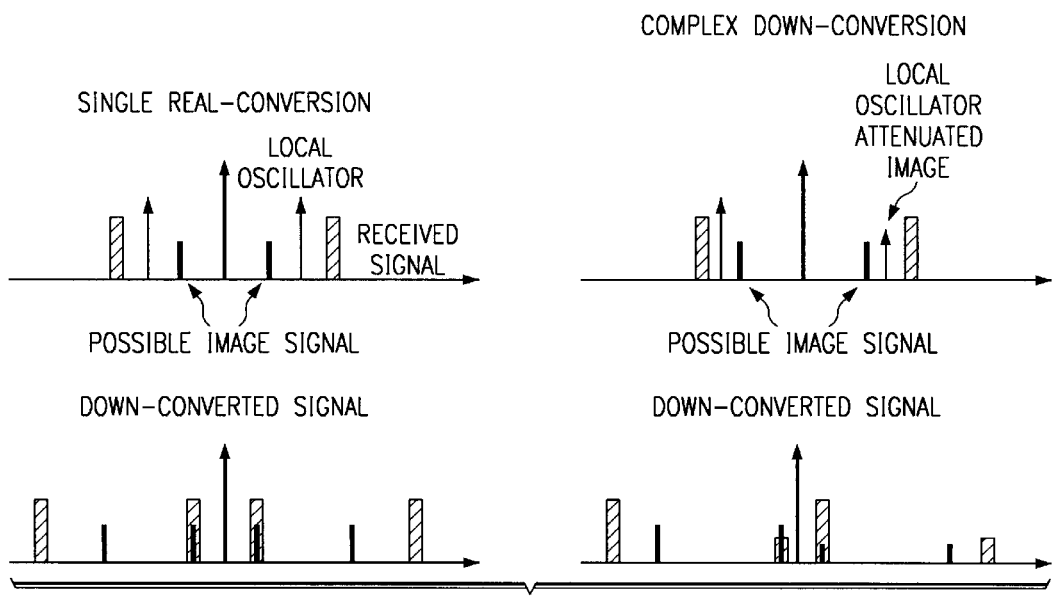
FIG. 1 depicts spectral representative of real and complex down conversions.
Figure 2A:
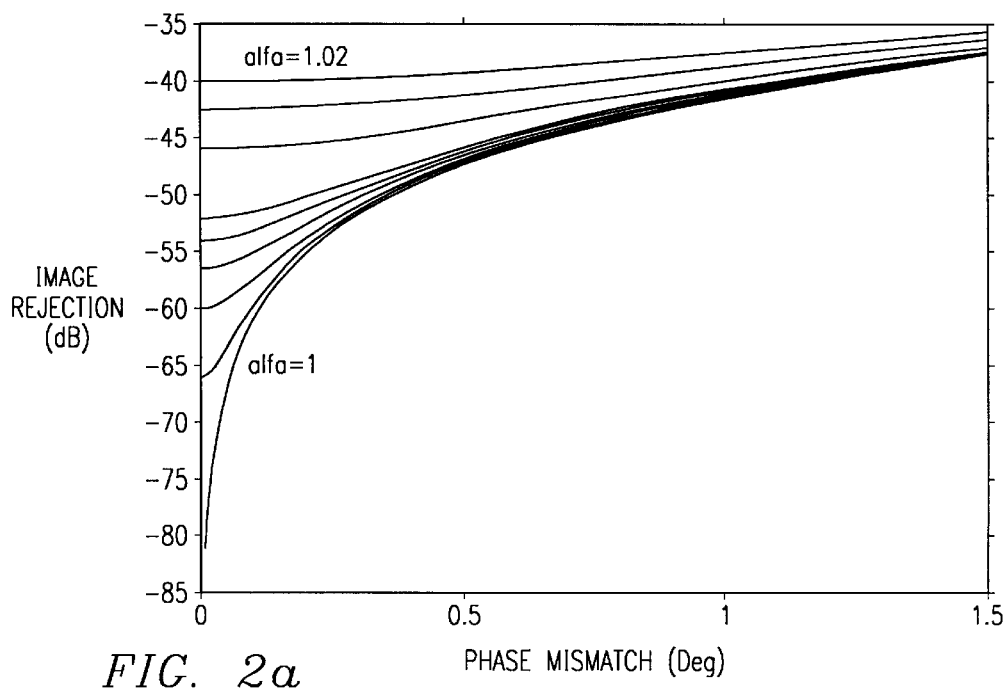
FIG. 2a depicts image rejection as a function of phase mismatch.
Figure 2B:
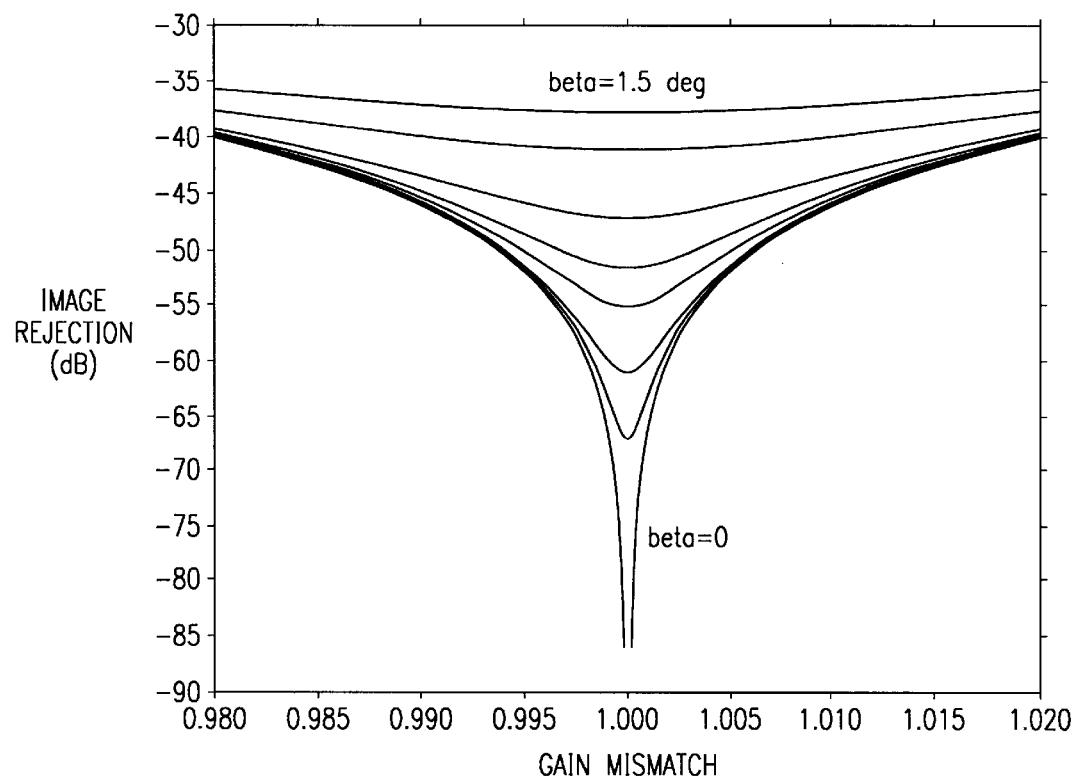
FIG. 2b depicts image rejection as a function of gain mismatch.

Image rejection as a function of the phase and gain mismatches is summarized in FIG. 2a and FIG. 2b.

The present invention specifically improves image rejection by using signal processing to estimate and minimize phase and gain mismatches.

Assuming a received signal is of the form:

$$s(t)=i(t)\cos(\omega_0 t)-q(t)\sin(\omega_0 t)$$

And two local oscillators:

$$Lo_1 = \cos\left(\omega_0 t - \frac{\theta}{2}\right)$$

$$Lo_2 = -\sin\left(\omega_0 t + \frac{\theta}{2}\right)$$

The resulting signals after down-conversion (assuming low-pass filters after the mixers) are:

$$\tilde{i}(t) = \frac{1}{2}\left[i(t)\cos\left(\frac{\theta}{2}\right) - q(t)\sin\left(\frac{\theta}{2}\right)\right]$$

$$\tilde{q}(t) = \frac{1}{2}\left[q(t)\cos\left(\frac{\theta}{2}\right) - i(t)\sin\left(\frac{\theta}{2}\right)\right]$$

Cross-correlating the two products (with zero delay) we get:

$$R_{\tilde{i}\tilde{q}}(0) = E\{\tilde{i}(t)\tilde{q}(t)\} = -\frac{1}{8}\sin\theta(\sigma_i^2 + \sigma_q^2)$$

While calculating their variance gives:

$$\sigma_{\tilde{i}}^2 = \frac{1}{4}\left[\sigma_i^2 \cos^2\left(\frac{\theta}{2}\right) + \sigma_q^2 \sin^2\left(\frac{\theta}{2}\right)\right]$$

$$\sigma_{\tilde{q}}^2 = \frac{1}{4}\left[\sigma_q^2 \cos^2\left(\frac{\theta}{2}\right) + \sigma_i^2 \sin^2\left(\frac{\theta}{2}\right)\right]$$

Small angle approximations yield:

$$\theta = -2\frac{R_{\tilde{i}\tilde{q}}}{\sigma_{\tilde{i}}^2 + \sigma_{\tilde{q}}^2}$$

And finally the restored signals can be derived:

$$i(t)=2\tilde{i}(t)+\tilde{q}(t)\theta$$

$$q(t)=2\tilde{q}(t)+\tilde{i}(t)\theta$$

The above relationship suggests that by estimating the cross-correlation and the auto-correlation of the two mixer products, a receiver can restore the original signal, no matter what modulation the mixer products carry. Other techniques than the above can be utilized to estimate the phase and gain imbalance and provide a way to correct the impairments.

Figure 3:
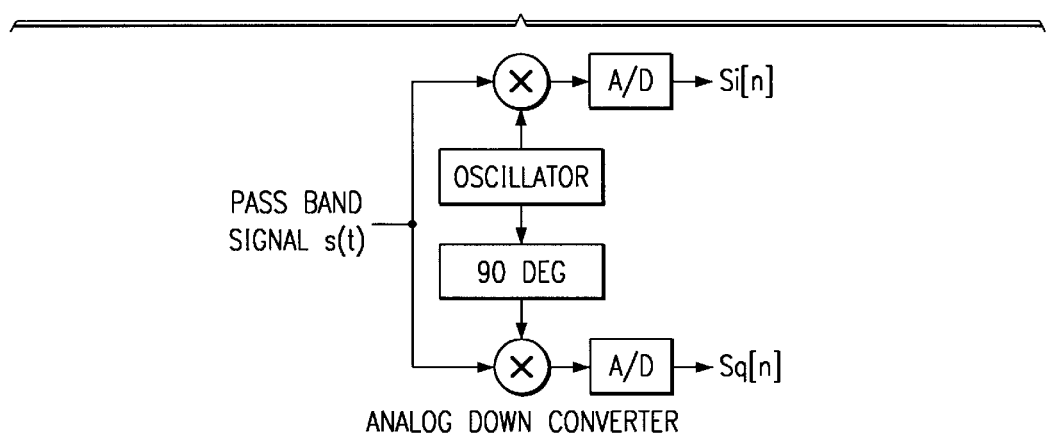
FIG. 3 depicts an apparatus employing the teachings of the present invention.
Figure 3:
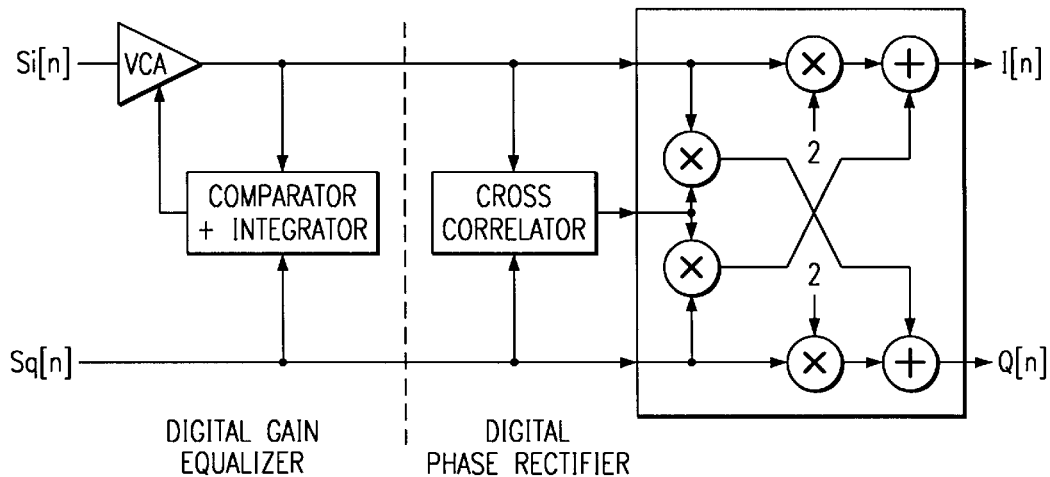

An exemplary implementation of the signal processing of the present invention is illustrated in FIG. 3.

The suggested processing and implementation has the following important benefits and characteristics:

1. The method applies both to direct conversion to baseband and near baseband conversion. There is no importance to the original passband signal center frequency. When the signal is exactly converted to baseband, the image is the frequency flipped version of the signal. If a near baseband conversion is used, the image signals may be greater in power compared to the main signal, requiring better estimation of the gain and phase mismatches.

2. The signal processing is basically blind; meaning that it does not require any information about the passband signal characteristics. The process can be performed on noise converted through the mixers. The result is that the process can be started at power up of the receiver, even before a signal exists, giving sufficient time for it to converge before acquiring the signal.

3. The processing is efficiently implemented without the need for feedback, thus simplifying the implementation. However, a feedback configuration may also be used, where the estimated phase and gain balance is used as feedback signal to correct the impairment either in the analog or digital domain.

What is claimed is:

1. An improved receiver comprising:
   a voltage controlled amplifier for adjusting the gain of a first input signal,
   a comparator and integrator for controlling said voltage controlled amplifier connected to the output of the voltage controlled amplifier and connected to a second input signal,
   a cross-correlator connected to the output of said voltage controlled amplifier and said second input signal,
   a first auto correlator connected to the output of said voltage controlled amplifier,
   a second auto correlator connected to said second input signal,
   a first mixer connected to said cross-correlator and the output of said voltage controlled amplifier for providing a correction signal to the signal output by said second auto correlator, and
   a second mixer connected to said cross-correlator and said second input signal for providing a correction signal to the signal output by said first auto correlator.

2. A method for improving image rejection by a receiver of a received signal s(t) of the form $s(t)=i(t)\cos(\omega_0 t)-q(t)\sin(\omega_0 t)$, comprising:
   estimating a cross-correlation of an imaginary and real input signals,
   estimating an auto-correlations of the imaginary and real input signals, and
   reconstructing said imaginary and real input signals using said estimated cross-correlation and auto-correlations in accordance with $i(t)=2i(t)+q(t)\theta$ and $q(t)=2q(t)+i(t)\theta$ where: $\theta$=phase angle $i(t)=i_{signal}(t)+i_{image}(t)$ $i_{signal}(t)=\frac{1}{2} A(t)\cos(\omega_{IF}t+\phi(t))$ $i_{image}(t)=\frac{1}{2} \beta(t)\cos(\omega_{IF}t+\beta-\phi(t))$ $\omega_{IF}=\omega_0-\omega_t$ $q(t)=q_{signal}(t)+q_{image}(t)$ $q_{signal}(t)=\frac{1}{2} \alpha A(t)\cos(\omega_{IF}t+\phi(t)+\beta)$ $q_{image}(t)=\frac{1}{2} \alpha\beta(t)\sin(\omega_{IF}t+\beta-\phi(t))$ $\beta$=arbitrary phase $\alpha$=arbitrary phase $\phi$=phase angle of signal $\varphi$=phase angle of signal A=amplitude of signal $\omega_{IF}$=intermediate frequency $\omega_0$=frequency at time zero $\omega_t$=frequency at time t.

* * * * *